(12) United States Patent
Kim et al.

(10) Patent No.: US 12,107,120 B2
(45) Date of Patent: Oct. 1, 2024

(54) POWER SEMICONDUCTOR DEVICE

(71) Applicant: HYUNDAI MOBIS CO., LTD., Seoul (KR)

(72) Inventors: Tae Youp Kim, Yongin-si (KR); Hyuk Woo, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 402 days.

(21) Appl. No.: 17/548,908

(22) Filed: Dec. 13, 2021

(65) Prior Publication Data

US 2022/0190105 A1    Jun. 16, 2022

(30) Foreign Application Priority Data

Dec. 11, 2020    (KR) .................. 10-2020-0173324

(51) Int. Cl.
*H01L 29/15*    (2006.01)
*H01L 29/06*    (2006.01)
(Continued)

(52) U.S. Cl.
CPC ...... *H01L 29/0615* (2013.01); *H01L 29/1608* (2013.01); *H01L 29/402* (2013.01)

(58) Field of Classification Search
CPC ............... H01L 29/402; H01L 29/0619; H01L 29/0623; H01L 29/407; H01L 29/7393; H01L 29/1608; H01L 29/7395; H01L 29/7811; H01L 29/404; H01L 29/66325; H01L 29/1095; H01L 29/0634; H01L 29/0607; H01L 29/0638; H01L 29/0804;
(Continued)

(56) References Cited

U.S. PATENT DOCUMENTS

2007/0272979 A1 * 11/2007 Saito ................... H01L 29/0634
257/E29.328
2013/0221427 A1 * 8/2013 Siemieniec ........... H01L 29/407
438/510

(Continued)

FOREIGN PATENT DOCUMENTS

CN    104241338 A  * 12/2014   ........... H01L 21/265
JP    2001168327 A  *  6/2001   ......... H01L 29/0634

(Continued)

OTHER PUBLICATIONS

Korean Office Action issued on Jan. 25, 2022 in the counterpart Korean Application No. 10-2020-0173324 (5 pages in English).

*Primary Examiner* — Niki H Nguyen
*Assistant Examiner* — Niki T Nguyen
(74) *Attorney, Agent, or Firm* — NSIP Law

(57) ABSTRACT

A power semiconductor device includes a substrate, including an active region and edge regions, including a semiconductor layer of a first conductive type including silicon carbide (SiC); an insulating film disposed on the edge regions; a field plate pattern disposed on the insulating film; a first doped region of a second conductive type disposed inside the substrate to extend downward from a top surface of the edge regions; a second doped region of the second conductive type, buried in the edge regions, extends in a direction having a vector component parallel to the top surface of the substrate; and a third doped region of the first conductive type is disposed on the second doped region and at a side portion of the first doped region.

13 Claims, 7 Drawing Sheets

(51) Int. Cl.
*H01L 29/16* (2006.01)
*H01L 29/40* (2006.01)
*H01L 31/0312* (2006.01)

(58) Field of Classification Search
CPC ............... H01L 21/04; H01L 29/8611; H01L 29/66712; H01L 29/0696; H01L 29/41708; H01L 29/4232; H01L 29/66333; H01L 29/8083
See application file for complete search history.

(56) References Cited

U.S. PATENT DOCUMENTS

2017/0243937 A1* 8/2017 Ward ................... H01L 29/0619
2017/0365669 A1* 12/2017 Kim .................... H01L 29/0623

FOREIGN PATENT DOCUMENTS

| JP | 2008004643 A | * | 12/2017 | ......... H01L 21/0257 |
| KR | 10-2011-0049249 A | | 5/2011 | |
| KR | 10-2018-0065766 A | | 6/2018 | |
| WO | WO-2014192437 A1 | * | 12/2014 | ......... H01L 21/0465 |

* cited by examiner

POWER SEMICONDUCTOR DEVICE

CROSS-REFERENCE TO RELATED APPLICATION

This application claims the benefit under 35 USC 119(a) of Korean Patent Application No. KR 10-2020-0173324, filed in the Korean Intellectual Property Office on Dec. 11, 2020, the entire disclosure of which is incorporated herein by reference for all purposes.

BACKGROUND

1. Field

The present disclosure relates to a power semiconductor device.

2. Description of Related Art

A power semiconductor device is a semiconductor device that operates under a high-voltage and high-current environment. Such power semiconductor device has been used in a field requiring high power switching. For example, the power semiconductor device has been used in power conversion, a power converter, an inverter or the like. For example, the power semiconductor device may include an insulated gate bipolar transistor (IGBT), or a power metal oxide semiconductor field effect transistor (MOSFET). In such a power semiconductor device, a withstand voltage characteristic is basically required, and recently, a high-speed switching operation has been additionally required.

Accordingly, researches and studies have been performed regarding a power semiconductor device using silicon carbide (SiC) instead of conventional silicon (Si). Silicon carbide (SiC), which is a wide-gap semiconductor material having a higher bandgap than that of silicon (Si), may maintain stability even at a high temperature, as compared to silicon (Si). Further, silicon carbide (SiC) remarkably highly exhibits an electric field for dielectric breakdown, as compared to silicon (Si). Accordingly, silicon carbide (SiC) may stably work even at a higher voltage. Therefore, silicon carbide (SiC) has a higher breakdown voltage than that of silicon (Si), and exhibits excellent heat dissipation. Accordingly, silicon carbide (SiC) is able to operate at a high temperature.

The power semiconductor device using such silicon carbide (SiC) has a problem in that a depletion region more extends outward due to negative charges at the interface between silicon carbide (SiC) and an oxide. In addition, when a termination region is designed in the same manner as a manner for a power semiconductor device using silicon (Si), an electric field is concentrated in the last region of a field limiting ring (FLR) due to negative charges, thereby degrading reliability.

PRIOR ART

Patent Document

Patent document 1 Korean Unexamined Patent Publication No. 2011-0049249 (published on May 12, 2011).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power semiconductor device includes a substrate, including an active region and edge regions, including a semiconductor layer of a first conductive type including silicon carbide (SiC); an insulating film disposed on the edge regions; a field plate pattern disposed on the insulating film; a first doped region of a second conductive type disposed inside the substrate to extend downward from a top surface of the edge regions; a second doped region of the second conductive type, buried in the edge regions, extends in a direction having a vector component parallel to the top surface of the substrate; and a third doped region of the first conductive type is disposed on the second doped region and at a side portion of the first doped region.

The third doped region may be a field stop region.

The second doped region may extend in a direction parallel to the top surface of the substrate.

A concentration of second conductive-type impurities of the first doped region may be higher than a concentration of the second conductive-type impurities in the second doped region.

The second doped region may extend in a lateral direction to connect with the first doped region.

The second doped region may extend toward the active region to connect with the first doped region.

A central portion of the second doped region may be positioned to be closer to the active region than a central portion of the first doped region is close to the active region. The third doped region may be positioned to be closer to the active region than the first doped region is close to the active region, and may be positioned on a region, which does not face the first doped region, of the second doped region.

Second doped regions may be disposed under the first doped region and spaced apart from each other. A central portion of the second doped region may be positioned to be closer to the active region than a central portion of the first doped region is close to the active region. The third doped region may be positioned to be closer to the active region than the first doped region is close to the active region, and is positioned on a region, which does not face the first doped region, of the second doped region.

The first doped region of the second conductive type may include a plurality of first doped regions of the second conductive type arranged to be spaced apart from each other. The second doped region of the second conductive type may include a plurality of second doped regions of the second conductive type, protruding in a lateral direction from the first doped region and arranged to be spaced apart from each other. A distance between one first doped region of the plurality of first doped regions and another first doped region, adjacent to the one first doped region, may be more increased as being away from the active region.

The field plate pattern may connect with the first doped region through a contact pattern formed through the insulating film. The field plate pattern may be positioned to be biased toward the active region from the contact pattern.

The field plate pattern may include a plurality of field plate patterns arranged to be spaced apart from each other. A distance between one field plate pattern of the plurality of field plate patterns and another field plate pattern, which is adjacent to the one field plate pattern, may be more increased as being away from the active region.

Other features and aspects will be apparent from the following detailed description, the drawings, and the claims.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
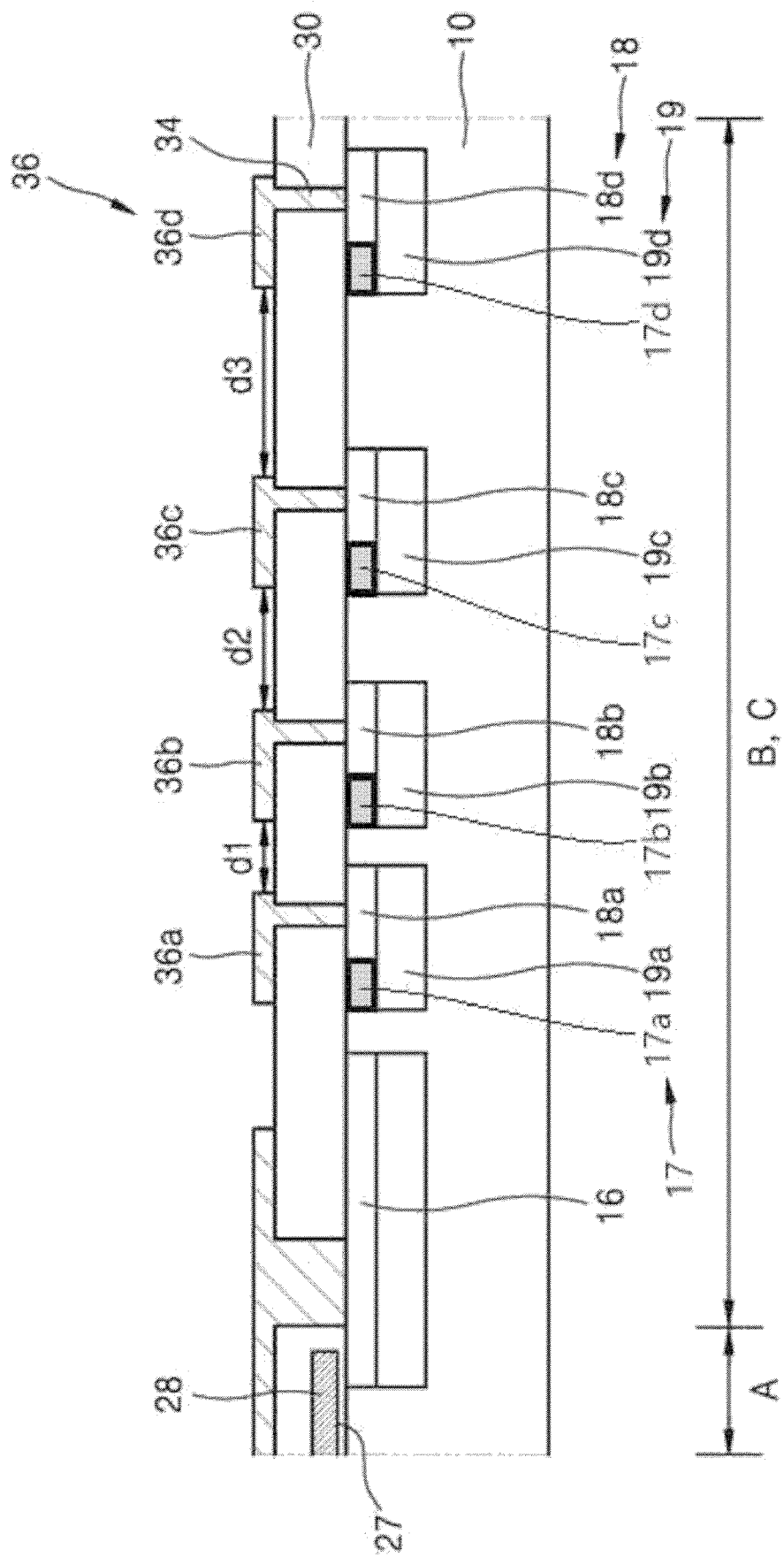
FIG. 1 is a cross-sectional view illustrating the structure of a power semiconductor device, according to an embodiment of the present disclosure.

Hereinafter, embodiments of the present disclosure will be described with reference to accompanying drawings. However, the present disclosure may be embodied in various different forms, and should not be construed as being limited only to the following illustrated embodiments. Rather, the following embodiments are provided as examples so that this disclosure will be thorough and complete, and will fully convey the concept of the present disclosure to those skilled in the art. For the convenience of explanation, some components in accompanying drawings may be exaggerated or reduced in size. The same reference numerals will be assigned to the same components in drawings.

Herein, a first conductive type and a second conductive type, which have mutually opposite conductive types, may have any one of an N type and a P type. For example, the first conductive type may be the N type, and the second conductive type may be the P type. In accompanying drawings, the above configuration of the conductive types is employed by way of example. However, the technical spirit of the present disclosure is not limited thereto. For another example, the first conductive type may be the P type, and the second conductive type may be the N type.

Hereinafter, for clarity of the technical field of the present disclosure, a comparative example for the present disclosure will be first described, and then an embodiment will be described.

The present disclosure has been made to solve the above-mentioned problems occurring in the prior art while advantages achieved by the prior art are maintained intact.

An aspect of the present disclosure provides a power semiconductor device using silicon carbide (SiC), capable of uniformly distributing the total termination voltage by preventing an electric field from being concentrated due to negative charges, thereby preventing a withstand voltage from being lowered. In addition, as the electric field is prevented from being concentrated, the reliability of the power semiconductor device may be improved. However, the object is provided only for the illustrative purpose, and the scope of the present disclosure is not limited thereto.

Figure 5:
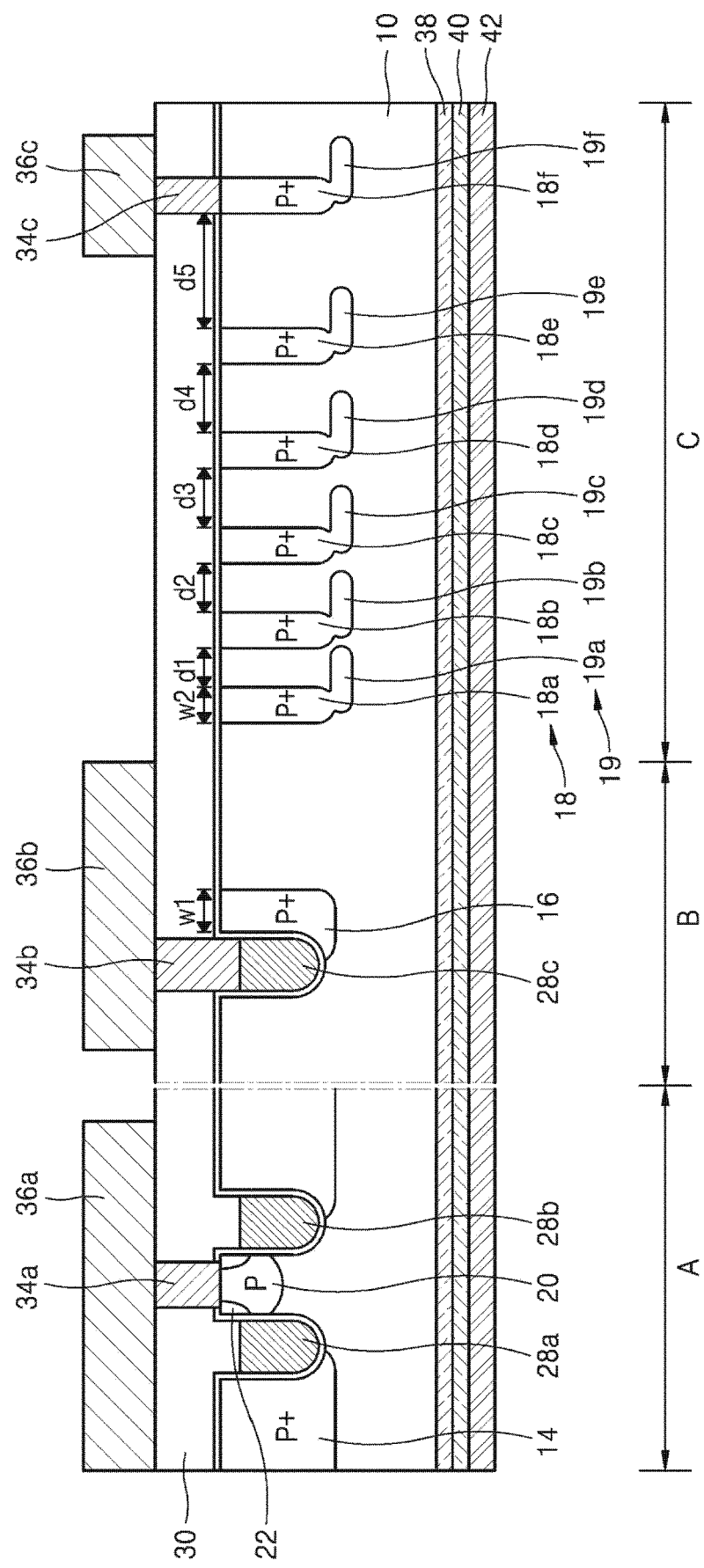
FIG. 5 is a cross-sectional view illustrating the structure of a power semiconductor device, according to a comparative example of the present disclosure.

FIG. 5 is a cross-sectional view illustrating the structure of a power semiconductor device, according to a comparative example for the present disclosure.

Referring to FIG. 5, the power semiconductor device according to the comparative example for the present disclosure includes an active region "A", edge regions "B" and "C", and a substrate 10 containing a semiconductor doped with impurities (first conductive impurities) in a first conductivity type.

The substrate 10 may be understood as the concept including a semiconductor wafer and an epitaxial layer epitaxially grown from the semiconductor wafer. The semiconductor wafer may include, for example, a silicon wafer which is lightly doped with the impurities in the first conductive type. For example, the doping concentration of impurities in the silicon wafer may be, for example, in the range of about $10^{13}$ to $10^{16}/cm^3$. When considering the doping concentration of the N-type impurities, the substrate 10 may be an N-substrate. However, the material and the doping concentration of the substrate 10 are not limited thereto. For example, the substrate 10 may have various materials and various doping concentrations.

The active region "A" includes a region in which a current is conducted in a vertical direction, as a plurality of active cells are present. The active region "A" is provided therein with gate electrodes 28a and 28b formed by lining a gate insulating film on an inner wall of a trench formed in the substrate 10 and then filling the trench with a gate electronic material, a body region 20, which is in the second conductive type, and a source region 22, which is in the first conductive type, between the gate electrodes 28a and 28b, and a floating well region 14 formed at one side of the gate electrode 28a or 28b. Further, the active region "A" may be provided therein with an interlayer insulating film 30 formed on a top surface of the substrate 10, and a first contact plug 34a making contact with the surface of the substrate 10 while passing through the interlayer insulating film 30.

A first pattern 36a having a flat top surface is provided on the interlayer insulating film 30. The first field plate pattern 36a may make contact with the first contact plug 34a. The first field plate pattern 36a may have the form to cover the most part of an upper portion of the active region "A". The first field plate pattern 36a may be provided as a film for wire bonding. In addition, the first field plate pattern 36a may serve as an emitter electrode.

A field stop region 38 may be provided on a bottom surface opposite to the top surface of the substrate 10. The field stop region 38 may be a region doped with impurities in the first conductive type. For example, the concentration of N-type impurities in the field stop region 38 may be in the range of about $10^{14}$ to $10^{18}/cm^3$. When considering the concentration of N-type impurities in the field stop region 38, the field stop region 38 may be referred to as an "N0 layer". A collector region 40 may be provided under the field stop region 38. The collector region 40 may be a region doped with impurities in the second conductive type. A second metal film 42 may be provided under the collector region 40. The second metal film 42 may serve as a collector electrode.

The edge regions "B" and "C" are disposed to be adjacent to the active region "A". The mutual position relationship among the edge regions "B" and "C" and the active region "A" may be provided in various forms. For example, the edge regions "B" and "C" may be formed to surround at least a portion of the active region "A".

One region of the edge regions "B" and "C" has a field plate pattern 36b which serves as a second field plate pattern different from the first field plate pattern 36a and is formed on the interlayer insulating film 30. The region is classified as a peripheral region "B". The field plate pattern 36b may prevent an electric field from being concentrated in an edge part. The filed plate pattern 36b may have a wider width to enhance the effect of preventing the electric field from being concentrated.

As the field plate pattern 36b is provided, an electric field may be prevented from being concentrated, even if the width "w1" of a junction termination extension part 16 is reduced. In addition, the field plate pattern 36b may be provided as a gate bus line electrically connected with the entire portion of the gate electrodes 28a and 28b formed in the active region "A". The field plate pattern 36b may be formed along a peripheral portion of the active region "A". For example, the field plate pattern 36b may be formed in a ring shape of a closed loop, but the shape of the field plate pattern 36b is not limited thereto.

The peripheral region "B" may have a connection part 28c disposed in a trench formed in the substrate 10. The connection part 28c may connect one first gate electrode 28a with one second gate electrode 28b adjacent to the first gate electrode 28a. A plurality of gate electrode patterns, which include the first gate electrode 28a, the second gate electrode 28b, and the connection part 28c, may be provided. The gate electrode patterns may be spaced apart from each other by a specific distance and repeatedly disposed. The gate electrode pattern may have one ring shape, when viewed in a plan view. As the connection part 28c has a rounded shape, an electric field is prevented from being concentrated in the connection part 28c.

The junction termination extension (JTE) part 16 may be provided in the substrate 10 to make contact with the connection part 28c. The junction termination extension part 16 may be doped with impurities in the same conductive type as that of the floating well region 14. The junction termination extension part 16 may be heavily doped with impurities in the second conductive type. The junction termination extension part 16 may have the shape of a ring surrounding an outer portion of the active region "A", when viewed in a plan view.

Another region of the edge regions "B" and "C" has at least one second doped region 19 which has the second conductive type, is buried in the substrate 10, and extends in a direction having a vector component parallel to the top surface of the substrate 10. The another region is classified as an edge termination region "C". The edge termination region "C" is a region to support a high withstand voltage.

The second doped region 19 in the second conductive type extends in a specific direction, and the specific direction has a vector component parallel to the top surface of the substrate 10. For example, the second doped region 19 may extend in a direction parallel to the top surface of the substrate 10. For another example, the second doped region 19 may extend in a direction of forming a first angle (however, except for 90 degrees) with respect to the top surface of the substrate 10.

According to an embodiment of the present disclosure, the power semiconductor device may include at least one first doped region 18 in the second conductive type, which is provided in the edge termination region "C" of the substrate 10, and has the form of extending downward from the top surface of the substrate 10. The first doped region 18 may have the shape of a ring surrounding an outer portion of the active region "A", when viewed in a plan view. The first doped region 18 may be heavily doped with impurities in the second conductive type. In addition, the first doped region 19, the floating well region 14, and the junction termination extension part 16 may have the same impurity concentration and the same junction depth.

The second doped region 19 in the second conductive type may have the form of protruding in a lateral direction of the first doped region 18. In the power semiconductor device illustrated in FIG. 5, the second doped region 19 may be connected with a distal end of a lower portion of the first doped region 18 to protrude in the lateral direction.

The at least one first doped region 18 in the second conductive type may include a plurality of first doped regions 18 in the second conductive type, which are arranged to be spaced apart from each other, and the at least one second doped region 19 in the second conductive type may include a plurality of second doped regions 19 in the second conductive type, which have forms of protruding in the lateral direction of the second doped region 18 and are arranged to be spaced apart from each other.

In this case, the distance between any one first doped region 18 of the plurality of first doped regions 18 in the second conductive type and another first doped region 18, which is right adjacent to the one first doped region 18, may be more increased as being away from the active region "A", to reduce the concentration of the electric field in an edge portion of a device. A distance d1, d2, d3, d4, or d5 between relevant first doped regions 18 may be subsequently increased in order of the distances d1, d2, d3, d4, and d5 from the distance d1 between the first doped regions 18a and 18b closest to the active region "A".

A third field plate pattern 36c may be provided on the interlayer insulating film 30 in the edge termination region "C" to make contact with a contact plug 34c. The third field plate pattern 36c may have the form connected with the at least one first doped region 18. The third field plate pattern 36c may have the shape of a ring, when viewed in a plan view. The third field plate pattern 36c may be a dummy pattern, and may not operate as an actual operating circuit. However, as the third field plate pattern 36c is provided, the concentration of the electric field may be more reduced.

Figure 6:
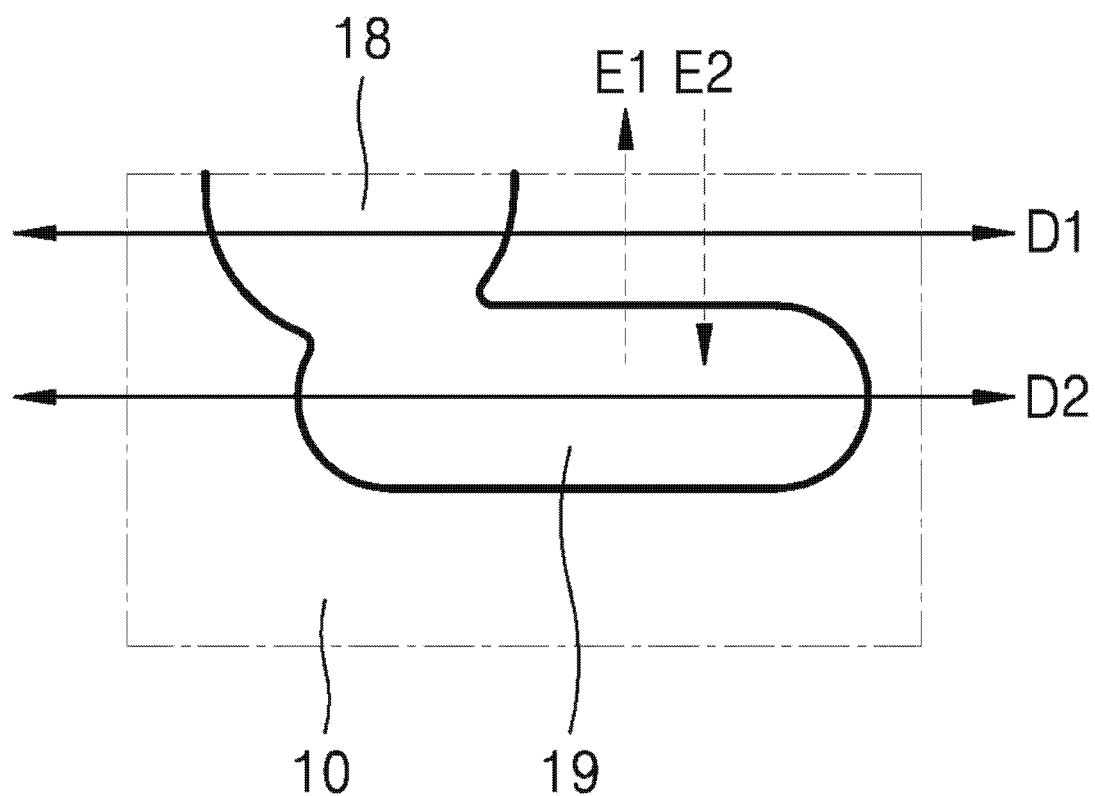
FIG. 6 is an enlarged view of the configuration of a second doped region and a first doped region illustrated in FIG. 5.
Figure 7:
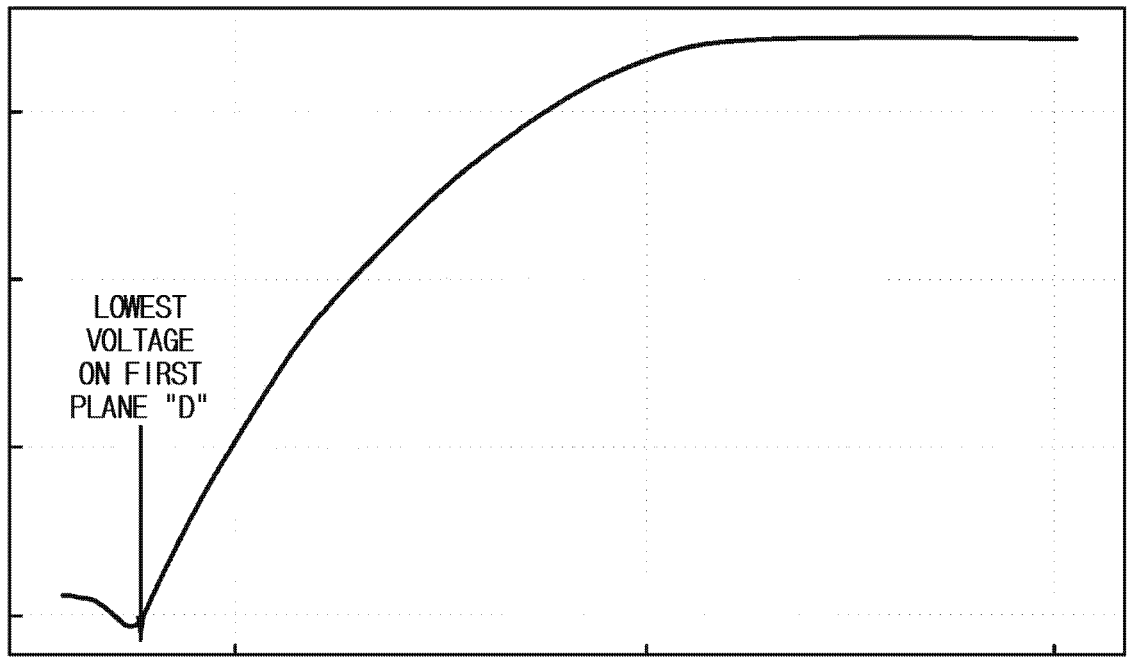
FIG. 7 is a graph illustrating voltage distribution in a direction of passing through a second doped region and a first doped region perpendicularly to a top surface of a substrate in a power semiconductor device, according to a comparative example of the present disclosure.

FIG. 6 is an enlarged view of the configuration of the second doped region and the first doped region illustrated in FIG. 5, and FIG. 7 is a graph illustrating voltage distribution in a direction of passing through a second doped region and a first doped region perpendicularly to a top surface of a substrate in a power semiconductor device, according to a comparative example of the present disclosure.

Referring to FIGS. 5 to 7, regarding the voltage distribution in a direction perpendicular to the top surface of the substrate 10 in the edge termination region "C", a reverse voltage section is formed between a first plane "D1" passing through the second doped region 19 in the direction parallel to the top surface of the substrate 10 and a second plane "D2" passing through the first doped region 18 in the direction parallel to the top surface of the substrate 10 and positioned above the first plane "D1", such that the lowest voltage is formed on the first plane "D1". As the reverse voltage section is formed, an electric field may be formed in the direction of the first plane "D1" from the second plane "D2" at the interface between the substrate 10, which contains a semiconductor doped with the first conductive type-impurities, and the insulating film 30.

As a second comparative example for the present disclosure, a power semiconductor device having no second doped region 19 may be considered. According to the second comparative of the present disclosure, although a termination junction increases a horizontal electric field efficiency using a field plate pattern, a voltage difference is made in a direction of an insulating film (oxide) from a substrate (Si) under a field plate pattern, thereby forming a vertical electric field toward the oxide at the silicon-oxide interface. In addition, holes move toward the oxide along the electric field in reliability testing to break the hydrogen-treated dangling bonds on the surface. Accordingly, the change in charge at the silicon interface, thereby causing the problem of the change in breakdown voltage (BV).

To the contrary, in the power semiconductor device according to the embodiment of the present disclosure, a reverse voltage section may be formed between the first surface "D1" and the second surface "D2" by employing the above-described first doped region 19, and an electric field may be generated in a direction from the second surface "D2" to the first surface "D1" at the silicon-oxide interface. Accordingly, it is possible to prevent BV deterioration caused by the change in dangling bond charge in silicon during the high-temperature reverse voltage reliability testing by suppressing the change in interface charge caused by the collision of the holes at the interface.

According to the above-described embodiments of the present disclosure, a vertical (from top to bottom) reverse voltage is generated by using the potential of the junction at the oxide-silicon interface of the termination junction, thereby preventing the deterioration of characteristics due to the change in charge in silicon at the interface in the high-temperature reverse voltage reliability testing.

However, in the power semiconductor device using the substrate including a semiconductor layer including silicon carbide (SiC), a depletion region more extends outward due to negative charges at the interface between silicon carbide (SiC) and an oxide.

Figure 3:
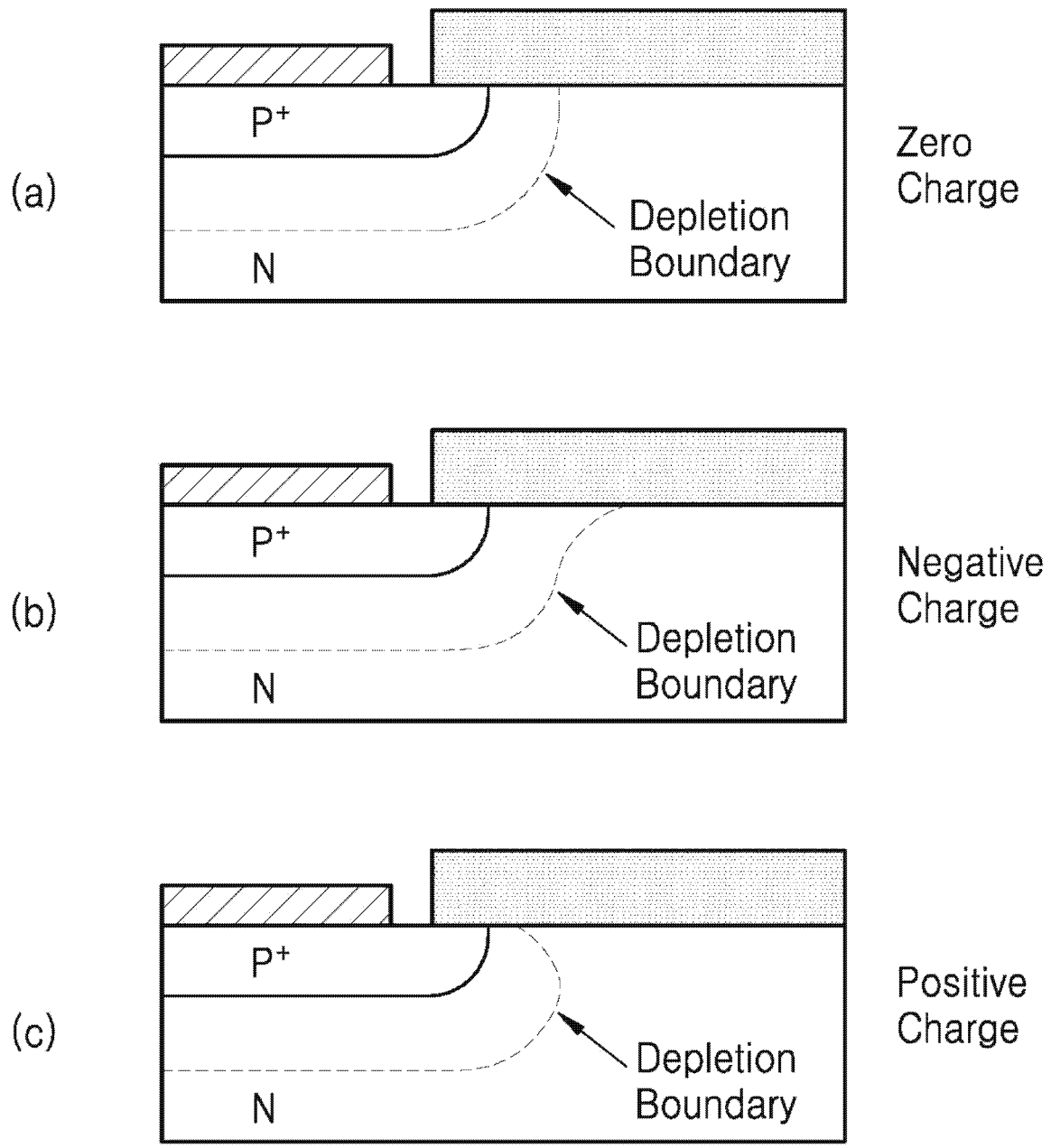
FIG. 3 illustrates an influence exerted on a BV by charges present at an oxide interface.
Figure 4:
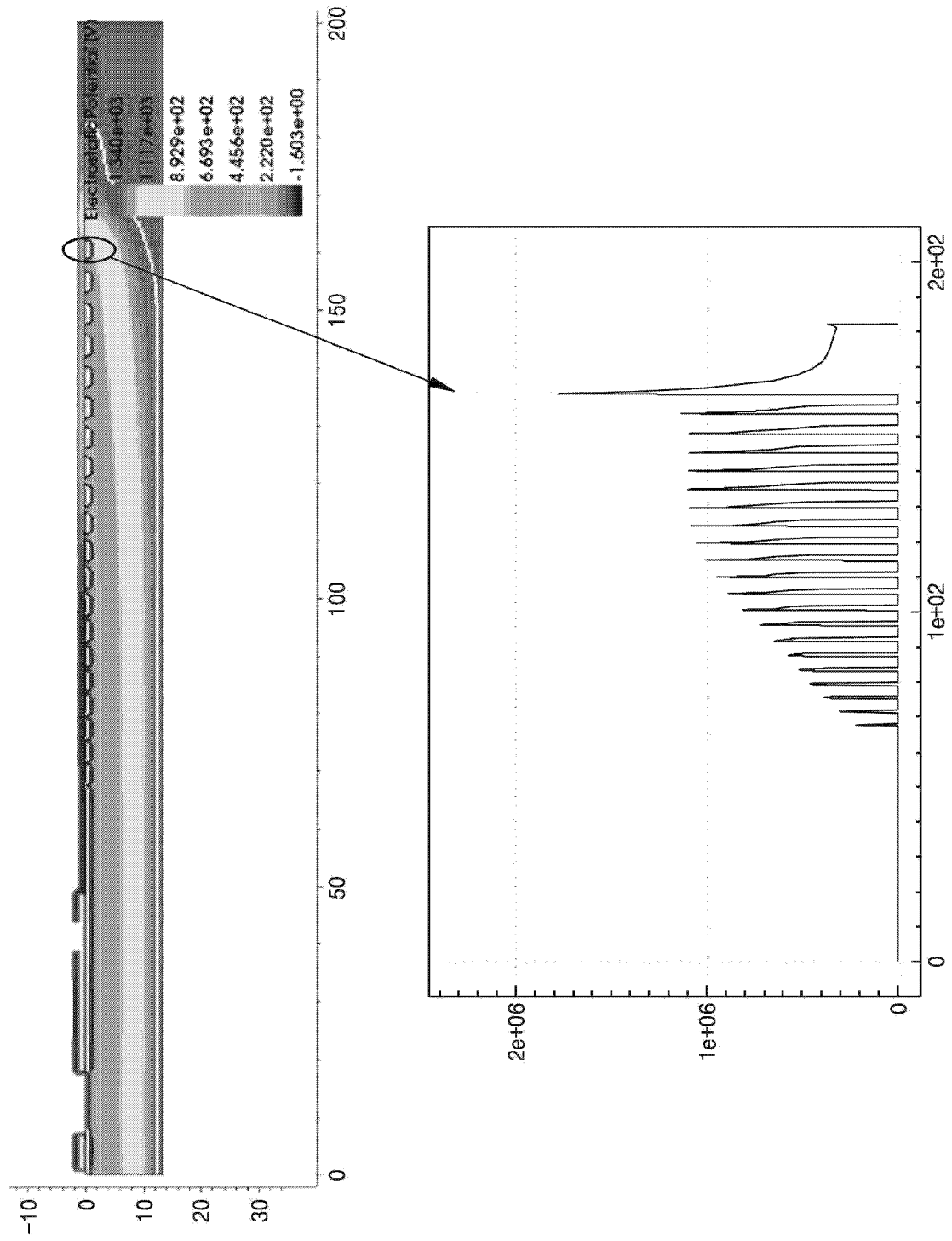
FIG. 4 illustrates an aspect that an electric field is concentrated in the last region of a field limiting ring due to negative charges.

FIG. 3 illustrates an influence exerted on BV by charges present at an oxide interface, and FIG. 4 illustrates an aspect that an electric field is concentrated in the last region of a field limiting ring due to the negative charges.

It may be recognized from FIG. 3 that when a gate is formed, a boundary (depletion boundary) of a depletion region more extends outward due to the influence exerted by negative charges (see reference sign (b) of FIG. 3). The phenomenon becomes a main cause to degrade the reliability in a silicon carbide (SiC) MOSFET. In other words, the power semiconductor device using silicon carbide (SiC) may have a problem in that the depletion boundary more extends outward due to negative charges resulting from a carbon cluster formed in a gate insulating film.

In this case, when a termination design described with reference to FIGS. 5 to 7 is applied, an electric field is concentrated in the last region of a field limiting ring due to negative charges, thereby degrading reliability. In the power semiconductor device, a termination structure refers to an outer structure formed to prevent a withstand voltage from being lowered due to a curvature of an outer junction of a chip. It may be recognized from FIG. 4 that an electric field is concentrated in the last region of the field limiting ring due to the negative charges.

The present disclosure is to provide a power semiconductor device using silicon carbide (SiC), capable of uniformly distributing the total termination voltage by preventing an electric field from being concentrated due to negative charges, thereby preventing a withstand voltage from being lowered. In addition, as the electric field is prevented from being concentrated, the reliability of the power semiconductor device may be improved.

FIG. 1 is a cross-sectional view illustrating some components of a power semiconductor device, according to an embodiment of the present disclosure.

Referring to FIG. 1, according to an embodiment of the present disclosure, a power semiconductor device includes an active region "A" and edge regions "B" and "C" and includes a substrate 10 including a semiconductor layer which includes silicon carbide and is doped with impurities in the first conductive type.

The semiconductor layer constituting the substrate 10 may be referred to as one material layer or a plurality of semiconductor material layers, and may be, for example, referred to as one epitaxial layer or multiple epitaxial layers. Further, the semiconductor layer may be referred to as one epitaxial layer or multiple epitaxial layers on a semiconductor substrate.

For example, the semiconductor layer may include silicon carbide (SiC). In more detail, the semiconductor layer may include at least epitaxial layer including silicon carbide (SiC).

Silicon carbide (SiC) may have a wider bandgap and may more maintain stability at a higher temperature, as compared with silicon (Si). Further, silicon carbide (SiC) remarkably highly exhibits an electric field for dielectric breakdown, as compared to silicon (Si). Accordingly, silicon carbide (SiC) may stably work even at a higher voltage. Accordingly, a power semiconductor device, in which silicon carbide (SiC) is applied to a semiconductor layer, has a higher breakdown voltage, exhibits more excellent heat dissipation, and has a more stable operating characteristic at a high temperature, as compared with a power semiconductor device employing silicon (Si).

In more detail, the semiconductor layer may include a drift region. The drift region may have the first conductive type, and may be formed by implanting first conductive type-impurities into a part of the semiconductor layer. For example, the drift region may be formed by doping the first conductive type-impurities into an SiC epitaxial layer. The drift region may provide a vertical moving path of charges.

The description of the active region "A" and edge regions "B" and "C" may be substituted with the description made with reference to FIGS. 5 to 7. The boundary configuration between the active region "A" and the edge regions "B" and "C" is not limited to the configuration schematically illustrated in FIG. 1. The gate electrode 28 and the gate insulating film 27 are provided in the active region "A". The gate structure may be provided in a trench gate structure or a planar gate structure.

According to an embodiment of the present disclosure, a power semiconductor device includes an insulating film 30 formed on the edge regions "B" and "C" of the substrate 10; at least one field plate pattern 36 formed on the insulating film 30, at least one first doped region 18 (e.g., reference number 18a, 18b, 18c, and 18d) in the second conductive type, which is formed inside the substrate 10 and extends downward from a top surface of the edge regions "B" and "C" of the substrate 10, at least one second doped region 19 (reference numbers 19a, 19b, 19c, and 19d) in the second conductive type, which is buried in the edge regions "B" and "C" of the substrate 10 and extends in a direction having a vector component parallel to the top surface of the substrate 10, and a third doped region 17 (e.g., reference numbers 17a, 17b, 17c, and 17d) in the first conductive type, which is positioned on the second doped region 19 (e.g., reference numbers 19a, 19b, 19c, and 19d) and at a side portion of the first doped region 18 (e.g., reference numbers 18a, 18b, 18c, and 18d).

The first doped region 18 (e.g., reference numbers 18a, 18b, 18c, or 18d) may be a field limiting ring (FLR) to increase a breakdown voltage. A plurality of filed limiting rings (FLR) are designed to distribute the withstand voltage such that the breakdown voltage is increased. A typical silicon device other than an SiC device has an almost negligible amount of charges at the interface. Accordingly, the concentration of the electric field in the last region of the field limiting ring (FLR) is not a major issue. However, in the SiC device, a depletion region more extends outward due to negative charges at the interface between silicon carbide and an oxide. When the termination design is made in the same manner as that of an Si device (see FIG. 5), the electric field is concentrated in the last region of the field limiting ring (FLR), so the reliability is degraded.

According to an embodiment of the present disclosure, in the power semiconductor device, the second doped region 19 (e.g., reference numbers 19a, 19b, 19c, and 19d) in the second conductive type is buried in the edge regions "B" and "C" of the substrate 10 to extend in the direction having a vector component parallel to the top surface of the substrate 10.

The first doped region 18 (e.g., reference numbers 18a, 18b, 18c, and 18d) may have a second conductive type-concentration higher than that of the second doped region 19 (e.g., reference numbers 19a, 19b, 19c, and 19d). For example, the second conductive type-concentration (P+) in the first doped region 18 (e.g., reference numbers 18a, 18b, 18c, and 18d) may be higher than a second conductive type-concentration (P−) in the second doped region 19 (e.g., reference number 19a, 19b, 19c, and 19d).

A plurality of second doped regions 19 (e.g., reference numbers 19a, 19b, 19c, and 19d) may be connected with a plurality of first doped regions 18 (e.g., reference numbers 18a, 18b, 18c, and 18d), respectively, to protrude in the lateral direction. In particular, the second doped region 19 (e.g., reference numbers 19a, 19b, 19c, and 19d) may be connected with the first doped region 18 (e.g., reference numbers 18a, 18b, 18c, and 18d) and may have the shape of extending toward the active region "A", which is different from the configuration illustrated in FIG. 5. According to the configuration of FIG. 5, the second doped region has the form of extending in a direction opposite to the direction of the active region "A" from the center of the first doped region.

According to the present embodiment, the central portion of each second doped region 19 (e.g., reference numbers 19a, 19b, 19c, and 19d) may be positioned to be closer to the active region "A" than the central portion of each relevant first doped region 18 (e.g., reference numbers 18a, 18b, 18c, and 18d) is close to the active region "A". In other words, the central portion of each second doped region 19 (e.g., reference numbers 19a, 19b, 19c, and 19d) may be biased toward the active region "A", compared to the central portion of each relevant first doped region 18 (e.g., reference numbers 18a, 18b, 18c, and 18d).

The third doped region 17 (e.g., reference numbers 17a, 17b, 17c, and 17d) is positioned to be closer to the active region "A" than the relevant first doped region 18 (e.g., reference numbers 18a, 18b, 18c, and 18d) is close to the active region "A", and may be positioned on the region, which does not face the first doped region 18 (e.g., reference numbers 18a, 18b, 18c, and 18d), of the second doped region 19 (e.g., reference numbers 19a, 19b, 19c, and 19d).

For example, the third doped region 17a in the first conductive type, which is positioned on the second doped region 19a and at a side portion of the first doped region 18a, may be positioned to be closer to the active region "A" than the first dope region 18a is close to the active region "A". The third doped region 17a may be positioned on a region, which does not face the first doped region 18a, of the second doped region 19a. In other words, the third doped region 17a may be positioned to correspond to a region in which the second doped region 19 is biased compared to the first doped region 18a. One side surface of the second doped region 19a may be formed to be aligned in line with one surface of the third doped region 17a. An opposite surface of the third doped region 17a may be configured to face one surface of the first doped region 18a. An opposite surface of the second doped region 19a may be configured to be aligned in line with an opposite surface of the first doped region 18a.

The descriptions of the configurations of the third doped region 17b, the third doped region 17c, and the third doped region 17d will be made similarly to the description of the configuration of the third doped region 17a.

The third doped region 17 (e.g., reference numbers 17a, 17b, 17c, and 17d) may be doped in the first conductive type to serve as a field stop region.

According to the combination of the first doped region 18 (e.g., reference numbers 8a, 18b, 18c, and 18d), the second doped region 19 (e.g., reference numbers 19a, 19b, 19c, and 19d), and the third doped region 17 (e.g., reference numbers 17a, 17b, 17c, and 17d) described above, a depletion region resulting from negative charges on the surface of silicon carbide (SiC) may be prevented from extending in a direction opposite to the direction of the active region "A" and reduce the vertical electric field, such that the withstand voltage performance is improved. In other words, the electric field is prevented from being concentrated in the last region of the filed limiting ring (FLR) due to negative charges to uniformly distribute the whole withstand voltage of the termination, such that the withstand voltage is prevented from being lowered.

According to an embodiment of the present disclosure, in the power semiconductor device, the at least one first doped region in the second conductive type includes a plurality of first doped regions 18a, 18b, 18c, and 18d in the second conductive type, the at least one second doped region 19 in the second conductive type includes a plurality of second doped regions 19a, 19b, 19c, and 19d in the second conductive type, which have forms of protruding in a lateral direction from the first doped region 18 and are arranged to be spaced apart from each other. In addition, the distance between any one first doped region of the plurality of first doped regions 18a, 18b, 18c, and 18d in the second conductive type and another first doped region, which is right adjacent to the one first doped region, may be more increased as being away from the active region "A".

For example, the plurality of first doped regions 18 (e.g., reference numbers 18a, 18b, 18c, and 18d) are arranged such that the distance between the first doped region 18b and the first doped region 18c right adjacent to the first doped region 18b is greater than the distance between the first doped region 18a and another first doped region 18b adjacent to the first doped region 18a, and the distance between the first doped region 18c and the first doped region 18d right adjacent to the first doped region 18c is greater than the distance between the first doped region 18b and another first doped region 18c adjacent to the first doped region 18b.

Meanwhile, according to an embodiment of the present disclosure, in the power semiconductor device, the field plate pattern 36 (e.g., reference numbers 36a, 36b, 36c, and 36d) is connected with the first doped region 18 (e.g., reference numbers 18a, 18b, 18c, and 18d) through a contact pattern 34 formed through the insulating film 30. The field plate pattern 36 (e.g., reference numbers 36a, 36b, 36c, and 36d) may be positioned to be biased toward the active region "A" from the contact pattern 34 The field plate pattern has a structure to enhance a breakdown voltage and is advantageous in terms of an area, as compared to the field limiting ring (FLR). Accordingly, a higher breakdown voltage may be realized.

At least one field plate pattern 36 may include a plurality of field plate patterns 36a, 36b, 36c, 36d arranged to be spaced apart from each other, and the distance between any one field plate pattern of the plurality of field plate patterns and another field plate pattern, which is right adjacent to the one field plate pattern, may be more increased as being away from the active region "A"

For example, the plurality of field plate patterns 36 (e.g., reference numbers 36a, 36b, 36c, and 36d) are arranged such that the distance "d2" between the field plate pattern 36b and the field plate pattern 36c right adjacent to the field late pattern 36b is greater than the distance "d1" between the field plate pattern 36a and the field plate pattern 36b right adjacent to the field late pattern 36a, and the distance "d3" between the field plate pattern 36c and the field plate pattern 36d right adjacent to the field late pattern 36c is greater than the distance "d2" between the field plate pattern 36b and the field plate pattern 36c right adjacent to the field late pattern 36b.

According to the configuration of the combination of the filed plate pattern 36 (e.g., reference numbers 36a, 36b, 36c, and 36d), the vertical electric field may be reduced through the field plate, thereby enhancing the withstand voltage performance.

When compared to the power semiconductor device according to the comparative example of the present disclosure described with reference to FIG. 5, the power semiconductor device according to an embodiment of the present disclosure described with reference to FIG. 1 has a different structure in a semiconductor layer constituting the substrate 10, and has different structures in the second doped region 19 and the field late pattern 36. Accordingly, the description of other components of the power semiconductor device according to an embodiment of the present disclosure may be substituted with the description made with reference to FIGS. 5 to 7.

Figure 2:
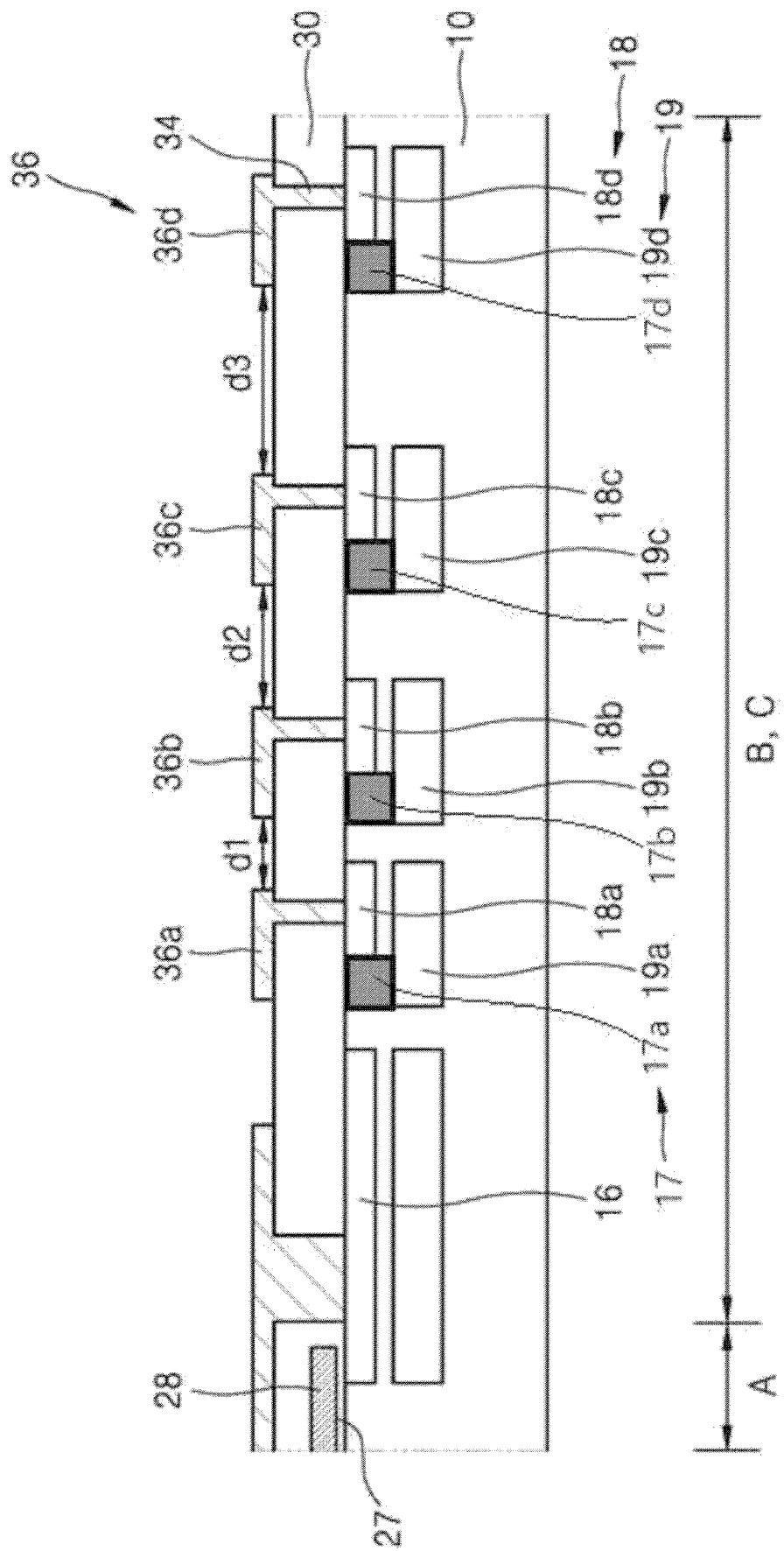
FIG. 2 is a cross-sectional view illustrating the structure of a power semiconductor device, according to another embodiment of the present disclosure.

FIG. 2 is a cross-sectional view illustrating some components of a power semiconductor device, according to another embodiment of the present disclosure.

Referring to FIG. 2, the second doped regions 19 (e.g., reference numbers 19a, 19b, 19c, and 19d) are disposed under the first doped regions 18 (e.g., reference numbers 18a, 18b, 18c, and 18d) and spaced apart from each other. The central portion of the second doped region 19 (e.g., reference numbers 19a, 19b, 19c, and 19d) may be positioned to be closer to the active region "A" than the first doped region 18 (e.g., reference numbers 18a, 18b, 18c, and 18d) is close the active region "A".

The third doped region 17 (e.g., reference numbers 17a, 17b, 17c, and 17d) is positioned to be closer to the active region "A" than the relevant first doped region 18 (e.g., reference numbers 18a, 18b, 18c, and 18d) is close to the active region "A". The third doped region 17 (e.g., reference numbers 17a, 17b, 17c, and 17d) may be positioned on the region, which does not face the first doped region 18 (e.g., reference numbers 18a, 18b, 18c, and 18d), of the second doped region 19 (e.g., reference numbers 19a, 19b, 19c, and 19d).

For example, the third doped region 17a in the first conductive type, which is positioned on the second doped region 19a and at a side portion of the first doped region 18a, may be positioned to be closer to the active region "A" than the first dope region 18a is close to the active region "A". The third doped region 17a may be positioned on a region, which does not face the first doped region 18a, of the second doped region 19a. In other words, the third doped region 17a may be positioned to correspond to a region in which the second doped region 19a is biased based on the first doped region 18a. One side surface of the second doped region 19a may be formed to be aligned in line with one surface of the third doped region 17a. An opposite surface of the third doped region 17a may be configured to face one surface of the first doped region 18a. An opposite surface of the second doped region 19a may be configured to be aligned in line with an opposite surface of the first doped region 18a.

The descriptions of the configurations of the third doped region 17b, the third doped region 17c, and the third doped region 17d will be made similarly to the description of the configuration of the third doped region 17a described above.

The third doped region 17 (e.g., reference numbers 17a, 17b, 17c, and 17d) may be doped in the first conductive type to serve as a field stop region.

Accordingly, the description of other components of the power semiconductor device according to another embodiment of the present disclosure may be the same as the description made with reference to FIG. 1, and thus, may be substituted with the description made with reference to FIG. 1.

According to the configuration of the combinations of the first doped region, the second doped region, and the third doped region described with reference to FIG. 2, the depletion region resulting from the negative charges on the SiC surface may be prevented from extending in a direction opposite to a direction of the active area "A" and reduce the vertical electric field, thereby enhancing the withstand voltage performance. In other words, the electric field is prevented from being concentrated in the last region of the filed limiting ring (FLR) due to negative charges to uniformly distribute the whole withstand voltage of the termination, such that the withstand voltage is prevented from being lowered.

According to the configuration of the combination of the filed plate pattern 36 (e.g., reference numbers 36a, 36b, 36c, and 36d), the vertical electric field may be reduced through the field plate, thereby enhancing the withstand voltage performance.

As described above, according to an embodiment of the present disclosure, there may be realized a power semiconductor device using silicon carbide (SiC), capable of uniformly distributing the total termination voltage by preventing an electric field from being concentrated due to negative charges, thereby preventing a withstand voltage from being lowered. In addition, as the electric field is prevented from being concentrated, the reliability of the power semiconductor device may be improved. The scope of the present disclosure is not limited to the above effect.

Hereinabove, although the present disclosure has been described with reference to embodiments and the accompanying drawings, the present disclosure is not limited thereto, but may be variously modified and altered by those skilled in the art to which the present disclosure pertains without departing from the spirit and scope of the present disclosure claimed in the following claims. Accordingly, the technical scope of the present disclosure is not limited to the detailed description of this specification, but should be defined by the claims.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A power semiconductor device comprising:
a substrate, comprising an active region and edge regions, comprising a semiconductor layer of a first conductive type comprising silicon carbide (SiC);
an insulating film disposed on the edge regions;
a field plate pattern disposed on the insulating film;
a first doped region of a second conductive type disposed inside the substrate to extend downward from a top surface of the edge regions;
a second doped region of the second conductive type, buried in the edge regions, extends in a direction having a vector component parallel to the top surface of the substrate; and
a third doped region of the first conductive type is disposed on the second doped region and at a side portion of the first doped region, wherein the third doped region is disposed closer to the active region than the first doped region.

2. The power semiconductor device of claim 1, wherein the third doped region is a field stop region.

3. The power semiconductor device of claim 1, wherein the second doped region extends in a direction parallel to the top surface of the substrate.

4. The power semiconductor device of claim 1, wherein a concentration of second conductive-type impurities of the first doped region is higher than a concentration of the second conductive-type impurities in the second doped region.

5. The power semiconductor device of claim 1, wherein the second doped region extends in a lateral direction to connect with the first doped region.

6. The power semiconductor device of claim 5, wherein the second doped region extends toward the active region to connect with the first doped region.

7. The power semiconductor device of claim 5, wherein a central portion of the second doped region is positioned to be closer to the active region than a central portion of the first doped region is close to the active region, and
wherein the third doped region is positioned on a region, which does not face the first doped region, of the second doped region.

8. The power semiconductor device of claim 1, wherein second doped regions are disposed under the first doped region and spaced apart from each other,
wherein a central portion of the second doped region is positioned to be closer to the active region than a central portion of the first doped region is close to the active region, and
wherein the third doped region is positioned on a region, which does not face the first doped region, of the second doped region.

9. The power semiconductor device of claim 1, wherein the first doped region of the second conductive type comprises a plurality of first doped regions of the second conductive type arranged to be spaced apart from each other,
wherein the second doped region of the second conductive type comprises a plurality of second doped regions of the second conductive type, protruding in a lateral direction from the first doped region and arranged to be spaced apart from each other, and
wherein a distance between one first doped region of the plurality of first doped regions and another first doped region, adjacent to the one first doped region, is more increased as being away from the active region.

10. The power semiconductor device of claim 1, wherein the field plate pattern connects with the first doped region through a contact pattern formed through the insulating film, and
wherein the field plate pattern is positioned to be biased toward the active region from the contact pattern.

11. The power semiconductor device of claim 1, wherein the field plate pattern comprises a plurality of field plate patterns arranged to be spaced apart from each other, and
wherein a distance between one field plate pattern of the plurality of field plate patterns and another field plate pattern, which is adjacent to the one field plate pattern, is more increased as being away from the active region.

12. A power semiconductor device comprising:
a substrate, comprising an active region and edge regions, comprising a semiconductor layer of a first conductive type comprising silicon carbide (SIC);
an insulating film disposed on the edge regions;
a field plate pattern disposed on the insulating film;
a first doped region of a second conductive type disposed inside the substrate to extend downward from a top surface of the edge regions;
a second doped region of the second conductive type, buried in the edge regions, extends in a direction having a vector component parallel to the top surface of the substrate; and
a third doped region of the first conductive type is disposed on the second doped region and at a side portion of the first doped region, wherein the third doped region is a field stop region.

13. A power semiconductor device comprising:
a substrate, comprising an active region and edge regions, comprising a semiconductor layer of a first conductive type comprising silicon carbide (SIC);
an insulating film disposed on the edge regions;
a field plate pattern disposed on the insulating film;
a first doped region of a second conductive type disposed inside the substrate to extend downward from a top surface of the edge regions;
a second doped region of the second conductive type, buried in the edge regions, extends in a direction having a vector component parallel to the top surface of the substrate; and
a third doped region of the first conductive type is disposed on the second doped region and at a side portion of the first doped region,
wherein a concentration of second conductive-type impurities of the first doped region is higher than a concentration of the second conductive-type impurities in the second doped region.

* * * * *